US008362760B2

(12) United States Patent (10) Patent No.: US 8,362,760 B2
Cairns et al. (45) Date of Patent: Jan. 29, 2013

(54) STIMULUS RESPONSIVE NANOPARTICLES

(75) Inventors: Darren Robert Cairns, Morgantown, WV (US); Wade W. Huebsch, Morgantown, WV (US); Konstantinos A. Sierros, Morgantown, WV (US); Matthew S. Shafran, Austin, TX (US)

(73) Assignee: West Virginia University Research Corporation, WVU Office of Technology Transfer, Morgantown, WV (US)

( * ) Notice: Subject to any disclaimer, the term of this patent is extended or adjusted under 35 U.S.C. 154(b) by 761 days.

(21) Appl. No.: 12/388,987

(22) Filed: Feb. 19, 2009

(65) Prior Publication Data

US 2009/0261815 A1 Oct. 22, 2009

Related U.S. Application Data

(60) Provisional application No. 61/066,384, filed on Feb. 19, 2008.

(51) Int. Cl.
*G01R 1/06* (2006.01)
*C30B 33/00* (2006.01)
(52) U.S. Cl. .......................... 324/149; 216/23
(58) Field of Classification Search .................. 324/149, 324/249; 216/23
See application file for complete search history.

(56) References Cited

U.S. PATENT DOCUMENTS

| 7,500,399 | B2 * | 3/2009 | Cheng et al. | 73/777 |
| 2008/0296563 | A1 * | 12/2008 | Bourgoin et al. | 257/40 |
| 2009/0021136 | A1 * | 1/2009 | Coll et al. | 313/496 |
| 2011/0240480 | A1 * | 10/2011 | Farrow et al. | 205/109 |

OTHER PUBLICATIONS

Broer, D.J., et al., "Liquid Crystalline Networks Formed by Photointiated Chain Cross-Linking", Chapter 10 of Liquid Crystals in Complex Geometries, London, 1996.
Broer, Dirk J., et al., "In-Situ Photopolymerization of Oriented Liquid-Crystalline Acrylates, 3a) Oriented Polymer Networks from a Mesogenic Diacrylate"., Makromol Chem., vol. 190, pp. 2255-2268 (1989).
Cairns, Darran R., et al., "Switching dynamics of Suspended Mesogenic Polymer Microspheres", Applied Physics Letter, vol. 78, No. 18, Apr. 30, 2001.
Fernandez-Nieves, Alberto, et al., "Optically Anisotropic Colloids of Controllable Shape", Adv. Mater, vol. 17, No. 6, Mar. 22, 2005.
Fernandez-nieves, Alberto, "Engineering Colloids with Optical and Geometrical Anisotropies: De-coupling Size Monodispersity and Particle Properties", Soft Matter, vol. 2, pp. 105-108, 2006.
Elias, A.L., et al., "Photopatterned Liquid Crystalline Polymers for Microactuators", J. Mater. Chem., vol. 16, pp. 2903-2912, 2006.
Sousa, Matthew E., et al., "Isotropic 'Islands' in a Cholesteric 'Sea': Patterned Thermal Expansion for responsive Surface Topologies", Adv. Mater., vol. 18, pp. 1842-1845, 2006.
Broer, D.J., et al., "Wide-Band Reflective Polarizers from Cholesteric Polymer Networks with a Pitch Gradient", nature, vol. 378, pp. 467-469, Nov. 30, 1995.
Yang, Huai, et al., "Thermally Bandwidth-Controllable Reflective Polarizers from (Polymer Network/Liquid Cyrstal/Chiral Dopant) Composites", Applied Physics Letters, vol. 82, No. 15, Apr. 14, 2003, pp. 2407-2409.

(Continued)

*Primary Examiner* — Bot Ledynh
(74) *Attorney, Agent, or Firm* — Thomas|Horstemeyer, LLP.

(57) ABSTRACT

Disclosed are various embodiments of methods and systems related to stimulus responsive nanoparticles. In one embodiment includes a stimulus responsive nanoparticle system, the system includes a first electrode, a second electrode, and a plurality of elongated electro-responsive nanoparticles dispersed between the first and second electrodes, the plurality of electro-responsive nanorods configured to respond to an electric field established between the first and second electrodes.

9 Claims, 5 Drawing Sheets

OTHER PUBLICATIONS

Amimori, Ichiro, et al., "Optomechanical Properties of Stretched Polymer Dispersed Liquid Crystal Films for Scattering Polarizer Applications". Journal of Applied Physics, vol. 93, No. 6, Mar. 15, 2003, pp. 3248-3252.

Evans, B.A., et al., "Magnetically Actuated Nanorod Arrays as Biomimetic Cilia", Nano Letters, vol. 7, No. 5, pp. 1428-1434, Published on Web Apr. 10, 2007.

Crawford, G.P., et al., "Characterization of the Cylindrical Cavities of Anopore and Nuclepore Membranes", Journal of Chem. Phys. vol. 96, No. 10, May 15, 1992, pp. 7788-7796.

Broer, D.J., et al., "Base Transitions in Restricted Geometries", Chapter 16 of Liquid Crystals in Complex Geometries, London, 1996.

Darran R. Cairns, et al., "Ordered Polymer Microstructures Synthesized from Dispersions of Liquid Crystal Mesogens", Division of Engineering, Brown University, Providence, RI, USA, first published Nov. 1, 2000 (352:1, 275-282), URL location: http://dx.doi.org/10.1080/10587250008023185.

* cited by examiner ized in a range of applications such as, but not limited to, electro-optical switches, optical filters, microfluidic devices, micromixers, micro-viscometers, fluidic pumps and stirrers, flow sensors, and electrorheological and/or magnetorheological fluids.

STIMULUS RESPONSIVE NANOPARTICLES

CROSS REFERENCE TO RELATED APPLICATIONS

This application claims priority to copending U.S. provisional application entitled "STIMULUS-RESPONSIVE FLUIDIC DISPERSIONS OF NANOPARTICLES" having Ser. No. 61/066,384, filed Feb. 19, 2008, which is incorporated herein by reference in its entirety.

STATEMENT REGARDING FEDERALLY SPONSORED RESEARCH OR DEVELOPMENT

This invention was made with Government support under Contract/Grant No. NCC5-570, awarded by the National Aeronautics and Space Administration, Experimental Program to Stimulate Competitive Research (NASA WV EPS-CoR). The Government has certain rights in this invention. This invention was also made with Government support under Contract No. NNX09CE79P, awarded by the National Aeronautics and Space Administration, and further was made with Government support under Contract No. NNG05GF80H, awarded through the Matt Shafran fellowship from WV Space Grant Consortium funded by NASA.

BACKGROUND

Liquid crystal monomers, also known as reactive mesogens, allow for molecular alignment to be controlled and for this alignment to be captured through photo-polymerization to form densely cross-linked, ordered polymer networks. Reactive mesogen polymers may be used in a range of applications including, but not limited to, responsive microstructures for electro-optical switches, geometrical and optical anisotropic colloids, thermally reactive polymer films, and optical filters.

SUMMARY

Embodiments of the present disclosure are related to stimulus responsive nanoparticles.

Briefly described, one embodiment, among others, includes a stimulus responsive nanoparticle system. The system includes a first electrode, a second electrode, and a plurality of elongated electro-responsive nanoparticles dispersed between the first and second electrodes, the plurality of electro-responsive nanorods configured to respond to an electric field established between the first and second electrodes.

Another embodiment, among others, includes a method for orienting an elongated electro-responsive nanoparticle within a dispersion fluid. The method includes establishing an electric field between a first electrode and a second electrode, the electric field extending through the dispersion fluid in proximity to the elongated electro-responsive nanoparticle and, responsive to the established electric field, reorienting the elongated electro-responsive nanoparticle within the dispersion fluid.

Another embodiment, among others, includes a method of fabricating elongated electro-responsive nanoparticles. The method includes filling an elongated electro-responsive nanoparticle template with reactive mesogen liquid crystal, curing the elongated electro-responsive nanoparticle template filled with reactive mesogen liquid crystal with UV light, etching away the elongated electro-responsive nanoparticle template, and separating the elongated electro-responsive nanoparticles using a sonicator.

Other systems, methods, features, and advantages of the present disclosure will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
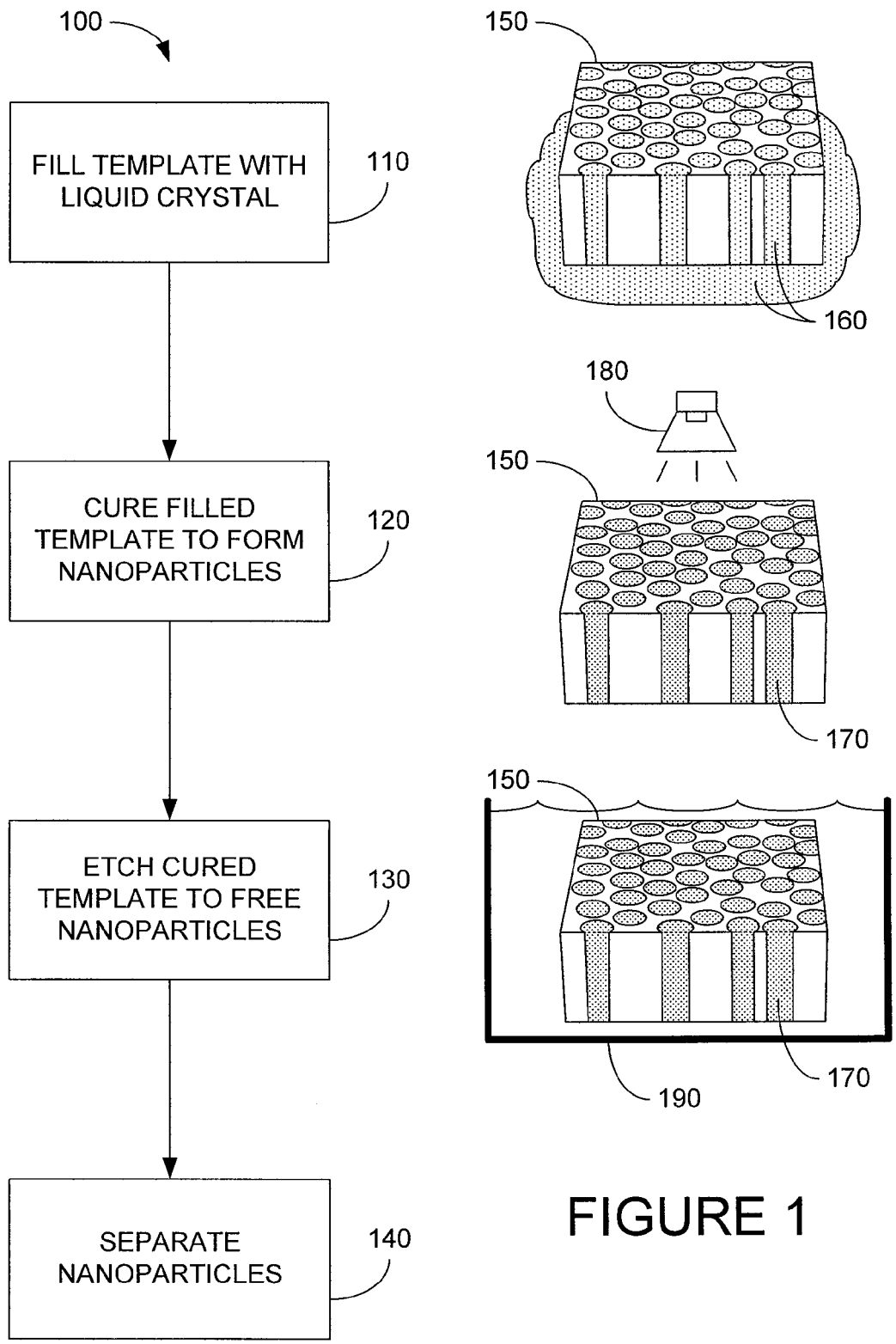
FIG. 1 illustrates an exemplary method for fabricating stimulus responsive nanoparticles according to one embodiment of the present disclosure.

Disclosed herein are various embodiments of methods and systems related to stimulus responsive nanoparticles. Reference will now be made in detail to the description of the embodiments as illustrated in the drawings, wherein like reference numbers indicate like parts throughout the several views.

Photo-polymerization of liquid crystal monomers, also known as reactive mesogens, allows a molecular alignment to be captured by forming densely cross-linked, ordered polymer networks. Before polymerization, externally-applied fields can be used to manipulate the molecular order to produce stimulus responsive nanoparticles such as, but not limited to, elongated electro-responsive nanoparticles, which are responsive to electric and/or magnetic field stimulation. Elongated electro-responsive nanoparticles may be utilized in a variety of applications such as, but not limited to, electro-optical switches, optical filters, microfluidic devices, micromixers, micro-viscometers, fluidic pumps and stirrers, flow sensors, and electrorheological and/or magnetorheological fluids.

FIG. 1 illustrates an exemplary method 100 for fabricating stimulus responsive nanoparticles according to one embodiment of the present disclosure. Beginning with block 110, a template 150 is filled with reactive mesogen liquid crystal 160. In one embodiment, Anopore membranes may be used as an elongated electro-responsive nanoparticle template to fabricate elongated electro-responsive nanoparticles. In some embodiments, the Anopore membranes have a thickness in the range of about 20 microns to about 100 microns. For example, the thickness of the Anopore membrane is about 60 microns. In exemplary embodiments, the Anopore membranes have a pore diameter in the range of about 20 nanometers to about 200 nanometers. Other embodiments may utilize other templates to provide other sizes and/or shapes.

The template 150 is filled with the reactive mesogen liquid crystal 160 in the nematic state. In one embodiment, the reactive mesogen liquid crystal 160 is RM257 (Merck). In other embodiments, reactive mesogen liquid crystals 160 can include, but are not limited to, RMM114 (Merck) and Paliocolor LC242 (BASF). In some embodiments, the reactive mesogen liquid crystal 160 may be mixed with a photoinitiator such as, but not limited to, Daracur 1173 (Ciba Geigy Chemicals) to aid in curing. The template 150 (e.g., Anopore membrane) may be positioned to allow filling by capillary action. Other methods of filling may also be utilized. After filling, excess reactive mesogen may be removed from the top and bottom of the template 150.

Figure 2:
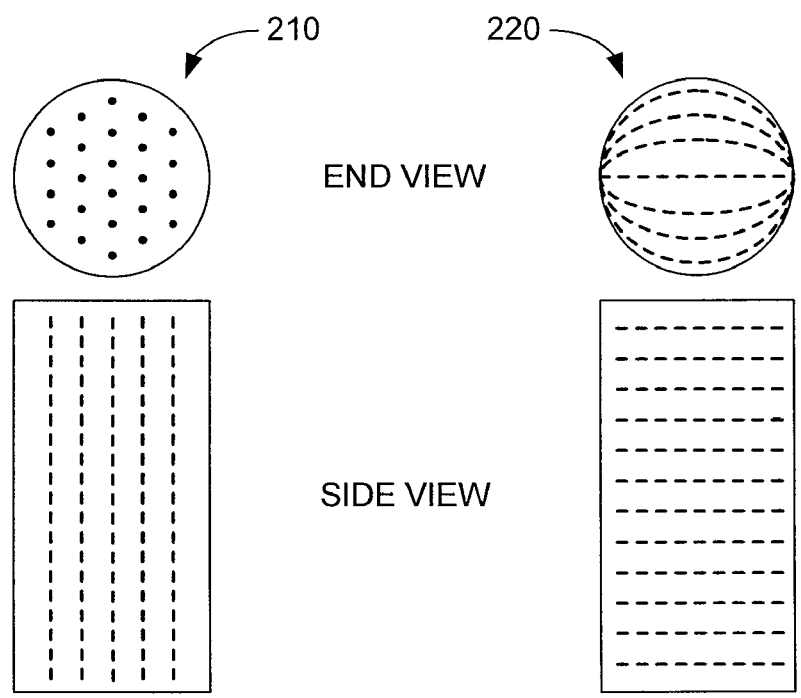
FIG. 2 illustrates a parallel axial director and a biplanar director in the stimulus responsive nanoparticles of FIG. 1, according to exemplary embodiments of the present disclosure.

The nematic liquid crystal phase is characterized by molecules that have no positional order but tend to point in the same direction along a director. In some embodiments, the director of the liquid crystal aligns parallel to the pore surface in an untreated Anopore membrane. One such configuration is the planar bipolar director. In other embodiments, the director of the liquid crystal aligns in a planar concentric director configuration or a parallel axis configuration in an Anopore membrane. The configuration is a function of the elastic properties of the liquid crystal monomer, the surface anchoring, and the presence of applied electric and/or magnetic fields. For example, as illustrated in FIG. 2, when confined in a cylindrical cavity the liquid crystal can adopt a director field similar to a parallel axial director 210 or a planar bipolar director 220.

Referring back to FIG. 1, the reactive mesogen liquid crystal in the filled template 150 is cured to form stimulus responsive nanoparticles 170 in block 120. The reactive mesogen liquid crystal 160 is cured while in the nematic range to capture the director field in the formed nanoparticles 170. In one embodiment, the reactive mesogen is cured by polymerizing in a UV curing chamber 180 while the temperature of the liquid crystal was kept between 71-74° C., which represents the lower boundary of the nematic range of the liquid crystal. This temperature can maintain the ordering of the molecular orientation of the liquid crystal parallel to the surface of the template. In other embodiments, temperatures are maintained between the melting/nematic phase transition temperature and the nematic/isotropic phase transformation temperature. The temperature during UV curing determines the order parameter and can be used to tailor the anisotropy of the stimulus responsive nanoparticles. In one embodiment, an electric and/or magnetic field is applied during curing to modify the director configuration.

After curing, the template 150 is removed from the stimulus responsive nanoparticles 170 in block 130. For example, the template 150 may be removed by etching in a bath 190. In one embodiment, an Anopore membrane used as the template 150 may be etched away from the stimulus responsive nanoparticles 170 by immersing the cured template in a 0.5M NaOH solution.

In block 140, the stimulus responsive nanoparticles 170 are separated. In one embodiment, the nanoparticles are separated using a sonicator (Branson 1510 R, 42 kHz) for a period of time (e.g., 15 minutes). The separated nanoparticles may then be dispersed in a nonconductive fluid or dispersion agent such as, but not limited to, silicone oil.

In the case of elongated electro-responsive nanoparticles, the shape of nanorods can include, but are not limited to, cylindrical and prolate spheroid. In some embodiments, the cross-section of the elongated electro-responsive nanoparticles is non-circular (e.g., an oval). In other embodiments, the cross-section of the elongated electro-responsive nanoparticles is an irregular geometric shape such as, but not limited to, a trapezoid, pentagon, and hexagon.

In some embodiments, the length of the elongated electro-responsive nanoparticles can range from about 1 micron to about 100 microns. In other embodiments, the length of the elongated electro-responsive nanoparticles can range from about 2 microns to about 60 microns. In another embodiment, the length of the elongated electro-responsive nanoparticles can range from about 10 microns to about 50 microns. The diameter of the elongated electro-responsive nanoparticles can range from about 10 nanometers to about 5 microns. In other embodiments, the diameter of the elongated electro-responsive nanoparticles can range from about 20 nanometers to about 1 micron. In another embodiment, the diameter of the elongated electro-responsive nanoparticles can range from about 20 nanometers to about 200 nanometers.

Figure 3:
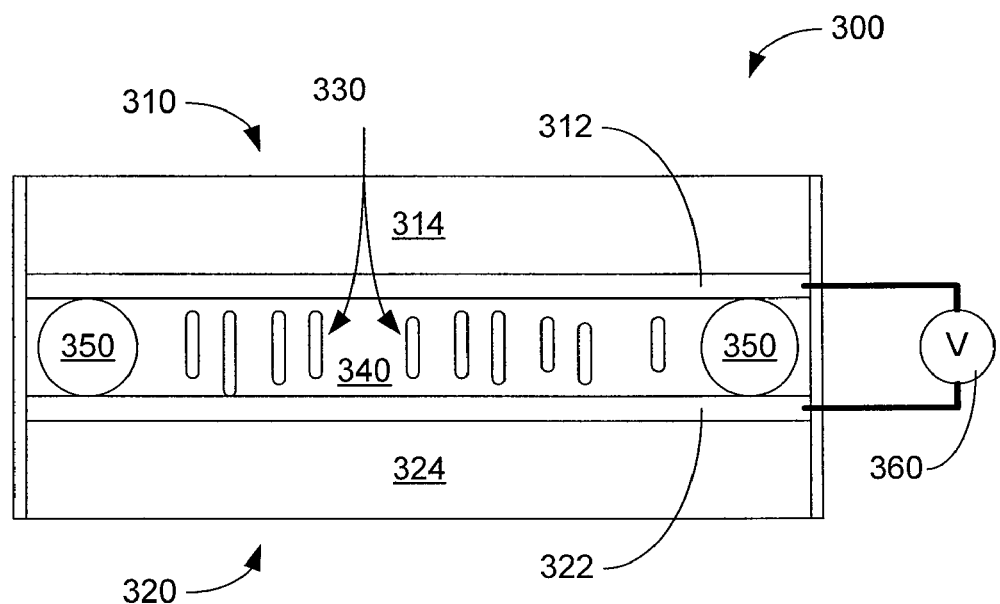
FIG. 3 is an illustration of a stimulus responsive nanoparticle system, including the stimulus responsive nanoparticles of FIG. 1, according to one embodiment of the present disclosure.

FIG. 3 is an illustration of a stimulus responsive nanoparticle system 300 according to one embodiment of the present disclosure. The stimulus responsive nanoparticle system 300 includes first and second electrodes, 310 and 320 respectively. In the embodiment of FIG. 3, the first and second electrodes 310 and 320 include a conducting film, 312 and 322 respectively, disposed on a surface of an insulating substrate, 314 and 324 respectively. In other embodiments, the first and second electrodes 310 and 320 include a conductive substrate. In alternative embodiments, the first and second electrodes 310 and 320 can include one or more conducting regions within an insulating substrate.

Some embodiments of the electrodes 310 and 320 may include multiple layers and/or regions. For example, one or more substrate layer may be used with one or more conducting layers. Alternatively, multiple conducting regions may be disposed on the same substrate to form multiple electrodes in the same plane. In some embodiments, patterned electrodes (e.g., one or more conductive trace, grid, or pattern disposed in a pattern on one or more substrate) may be included to establish an electric or a magnetic field. The conductivity of the layers may be classified as conducting, semi-conducting (including n-type or p-type), or superconducting. In some embodiments, multiple layers may be used to produce device layers and/or regions such as thin film transistors to actuate or establish an electric field.

The conducting film 312, conducting substrate, conducting layer and/or conducting region may be formed using conducting materials such as, but not limited to, metals, conductive ceramic materials, and conductive polymer materials. Metals can include, but are not limited to, silver, copper, iron, copper, and combinations thereof. Conductive ceramic materials can include, but are not limited to, indium oxides, tin oxides, zinc oxides, aluminum oxides, yttrium oxides, strontium oxides, and combinations thereof. Conductive polymers can include, but are not limited to, polythiophenes, polyanilines, polypyroles and combinations thereof. In other embodiments, conductive layers and/or regions can include semi-conducting organic materials such as, but not limited to, penatcene and carbon. In some embodiments, conductive layers and/or regions consist of conducting particles dispersed in a binder.

The first and second electrodes 310 and 320 may be transparent or opaque. In one embodiment, the electrodes 310 and 320 include an indium tin oxide (ITO) film disposed on a glass substrate. Other layers may also be included in one or more electrodes to produce effects such as, but not limited to, optical effects, improved reliability, induced orientation, and modified flow properties. In the embodiment of FIG. 3, the electrodes 310 and 320 are substantially planar. In other embodiments, the electrodes may conform to other shapes or configurations such as, but not limited to, semi-circular or angled.

In the embodiment of FIG. 3, elongated electro-responsive nanoparticles 330 are dispersed between the first and second electrodes 310 and 320. Elongated electro-responsive nanoparticles 330 include, but are not limited to, cylindrical and prolate spheroid nanorods. In one embodiment, the elongated electro-responsive nanoparticles 330 are dispersed in a non-conductive fluid or dispersion agent 340. Dispersion agents 340 can include, but are not limited to, silicone oil, de-ionized water, glycerol, corn syrup, and any other suitable nonconductive fluid. In the embodiment of FIG. 3, the elongated electro-responsive nanoparticles 330 and the dispersion agent 340 is sealed between the first and second electrodes 310 and 320.

In the embodiment of FIG. 3, the first and second electrodes 310 and 320 are substantially parallel and separated by a distance equal to or greater than a predefined length of the elongated electro-responsive nanoparticles 330 by spacers 350. For example, spacers with a diameter of about 60 microns may be used with elongated electro-responsive nanoparticles 330 with a length up to about 60 microns. In other embodiments, the first and second electrodes 310 and 320 are separated by a distance less than the longest length of the elongated electro-responsive nanoparticles 330. In one embodiment, the spacers 350 are polymethacrylate spacers. Other materials suitable for use with the dispersion agent 340 and the electrode materials may also be used.

A voltage is provided to the electrodes 310 and 320 by a voltage supply 360 to establish an electric field between the first and second electrodes 310 and 320. The voltage supply 160 can include, but is not limited to, a DC voltage supply, an AC voltage supply, or some other switched or controlled voltage supply. In other embodiments, the voltage supply 360 may be used to establish a magnetic field.

The orientation of elongated electro-responsive nanoparticles dispersed between electrodes may be altered by controlling the electric field established between the electrodes. For example, when a DC voltage is applied to the first and second electrodes 310 and 320 of the embodiment of FIG. 3, an electric field is established between the first and second electrodes, and extends through the dispersion fluid in proximity to the elongated electro-responsive nanoparticles 330. The direction of the electric field is determined by the polarity of the voltage supplied to the first and second electrodes 310 and 320.

Figure 4:
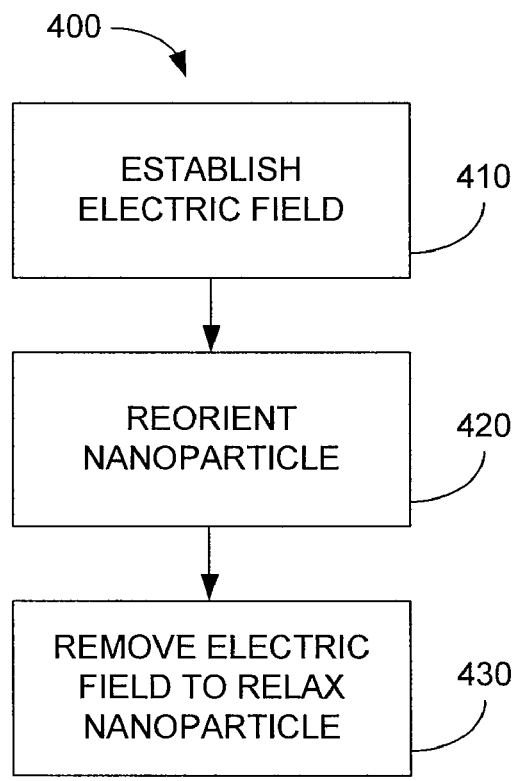
FIG. 4 illustrates an exemplary method for reorienting the stimulus responsive nanoparticles of FIG. 1, according to exemplary embodiments of the present disclosure.

FIG. 4 illustrates an exemplary method 400 for reorienting the stimulus responsive nanoparticles of FIG. 1, according to exemplary embodiments of the present disclosure. In block 410, an electric field is established in proximity to the stimulus responsive nanoparticles. With reference to the exemplary embodiment of FIG. 3, the electric field is established between the first and second electrodes 310 and 320. The electric field extends through the dispersion fluid 340 in proximity to the elongated electro-responsive nanoparticles 330.

Figure 5:
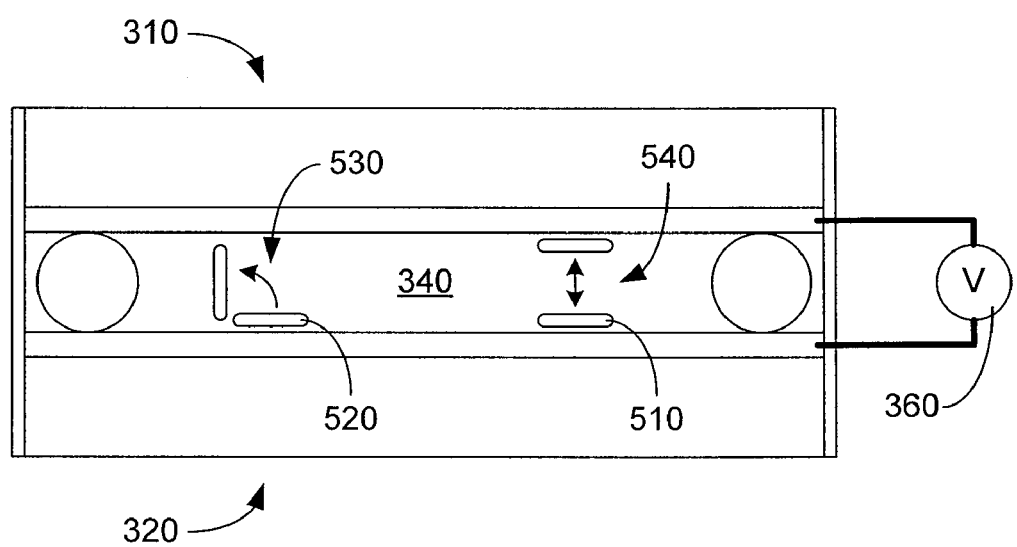
FIG. 5 illustrates exemplary reorientations of elongated electro-responsive nanoparticles included in the stimulus responsive nanoparticle system of FIG. 3, according to one embodiment of the present disclosure.

In response to the established electric field, the stimulus responsive nanoparticles are reoriented in block 420. FIG. 5 illustrates exemplary reorientations of the stimulus responsive nanoparticles included in the stimulus responsive nanoparticle system of FIG. 3, according to one embodiment of the present disclosure. In the exemplary embodiment of FIG. 5, in response to establishing the electric field, elongated electro-responsive nanoparticles 520 with a biplaner director 220 (FIG. 2) rotate 530 to align in parallel with the electric field as illustrated. In alternative embodiments, elongated electro-responsive nanoparticles 510 with a parallel axial director 210 (FIG. 2) translate 540 toward the first electrode 310, while remaining perpendicular to the electric field. Other reorientations may be possible.

A rotational response of elongated electro-responsive nanoparticles 520 may modeled to calculate theoretical switching times. Electric torque produced by the electric field may be modeled as:

$$T = |\Delta\epsilon|\epsilon_o E^2 V \cos\theta \sin\theta \quad (1)$$

where $|\Delta\epsilon|$ is the dielectric anisotropy of a perfectly aligned nematic, $\epsilon_o$ is the permittivity of free space, E is the field strength, $\theta$ is the angle of the elongated electro-responsive nanoparticle.

Torque as defined by mechanics may be modeled as:

$$\omega\frac{d\omega}{d\theta} = \frac{T}{I} \quad (2)$$

where the moment of inertia for a slender rod taken about the end of the rod may be modeled as:

$$I = \frac{1}{3}ML^2 \quad (3)$$

Combining equations (1) and (2) and then integrating twice results in an equation relating time and angle.

$$\Delta t = \sqrt{\frac{\rho L^2}{3|\Delta\epsilon|\epsilon_0 E^2}}\left[\ln\left(\tan\left(\frac{\theta_2}{2}\right)\right) - \ln\left(\tan\left(\frac{\theta_1}{2}\right)\right)\right] \quad (4)$$

where $\rho$ is the density, L is the length, E is the field strength, $\theta_1$ is the initial angle of the elongated electro-responsive nanoparticle 520, and $\theta_2$ is the final angle (e.g., 90°).

When the electric field is removed in block 430 (e.g., de-energizing voltage supply 160), the stimulus responsive nanoparticles relax back to their original orientation. Relaxation when the electric field is turned off and is driven by gravity and is relatively constant for the different field strengths. In some embodiments, other particles may be included in the dispersion agent 340 to interact with the stimulus responsive nanoparticles, such as the elongated electro-responsive nanoparticles 330, to amplify changes in viscosity and surface tension and affect response times.

FIGS. 6A-6D illustrate exemplary reorientation and relaxation responses of elongated electro-responsive nanoparticles, such as those included in FIG. 5, according to one embodiment of the present disclosure. Elongated electro-responsive nanoparticles 520 with a biplaner director 220 (FIG. 2) were dispersed between electrodes 310 and 320 as illustrated in FIG. 5. The elongated electro-responsive nanoparticles had a diameter of about 200 nanometers and a length of up to about 60 microns. The electrodes 310 and 320 comprise indium tin oxide (ITO) coated glass separated by 60 micron spacers.

Figure 6A:
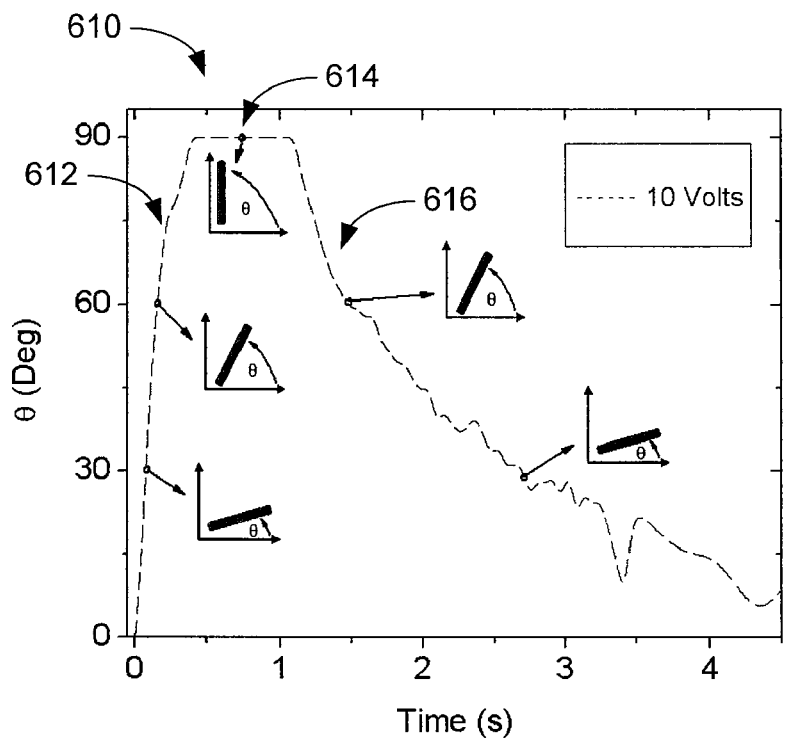
FIGS. 6A-6D illustrate exemplary reorientation and relaxation responses of the elongated electro-responsive nanoparticles, such as those included in FIG. 5, according to one embodiment of the present disclosure.

FIG. 6A is a graphical plot 610 depicting the typical angular variance of an elongated electro-responsive nanoparticle during the cycle of reorientation and relaxation with an application of 10 V. The switching time was driven by the electric field established between the electrodes 310 and 320. The elongated electro-responsive nanoparticle was observed using an optical microscope (Leitz LaborLux 12 Me, Mag. 20×). The angle of the elongated electro-responsive nanoparticle with respect to the glass plate plane was then calculated from the apparent length measured. The apparent length of the elongated electro-responsive nanoparticle during reorientation and relaxation was measured using Matlab image analysis.

The reorientation 612 of the elongated electro-responsive nanoparticle was initiated when the elongated electro-responsive nanoparticle was parallel to the electrode plane ($\theta=0°$) and finished when the elongated electro-responsive nanoparticle was perpendicular to the electrode plane ($\theta=90°$). As shown in FIG. 6A, the re-orientation time 612 for the observed elongated electro-responsive nanoparticle was approximately 0.385 seconds as measured using a frame grabber (Guppy, Allied Visions Technology), which captured optical images every 0.055 seconds.

After the elongated electro-responsive nanoparticle was perpendicular to the electrode plane ($\theta=90°$), the voltage was maintained for a period 614 to allow the position of the elongated electro-responsive nanoparticle to stabilize. The elongated electro-responsive nanoparticle was then allowed to relax 616 by removing the electric field until the elongated electro-responsive nanoparticle returned to its initial position.

Figure 6B:
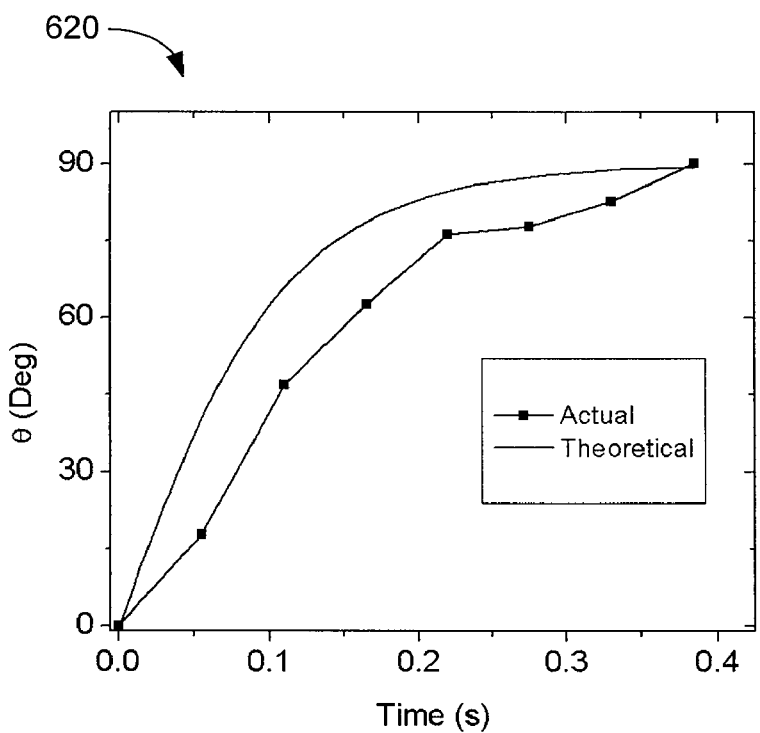

The observed reorientation time is compared to a predicted reorientation time in the graphical plot 620 of FIG. 6B. Equation (4) was used to model the observed elongated electro-responsive nanoparticle, where $\rho$ is the density (1000 kg/m$^3$), L is the length (30 μm), $|\Delta\in|$ is the dielectric anisotropy of a perfectly aligned nematic (2), $\in_o$ is the permittivity of free space, E is the field strength, $\theta_2$ is the final angle (90°), and $\theta_1$ is the initial angle (0°). This model assumes perfect alignment of the liquid crystal, no viscosity and uniform electric field strength. In addition, a dielectric anisotropy value ($\Delta\in$) of −2 was assumed, which corresponds to a perfect alignment of the director field. Calculating the effective dielectric anisotropy value from the actual switching time data, leads to a $|\Delta\in|$ value of 2.43×10$^{-4}$ for a field strength of 10 V.

Figure 6C:
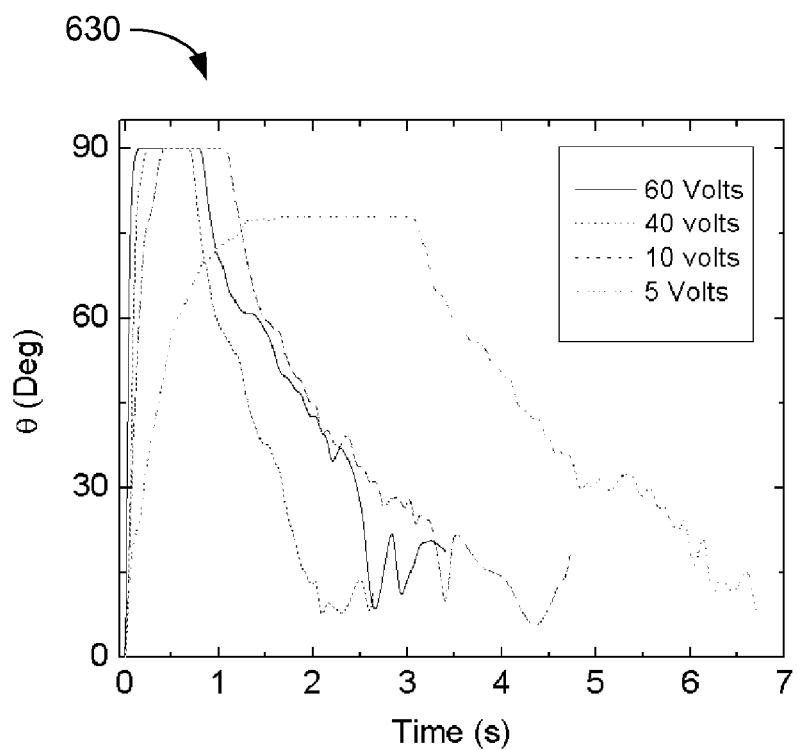

Observed reorientation times for different applied voltages (60 V, 40 V, 10 V, and 5 V) are depicted in the graphical plot 630 of FIG. 6C. As can be seen from FIG. 6C, the reorientation of the elongated electro-responsive nanoparticle is driven by the strength of the electric field. The responsive nature of the elongated electro-responsive nanoparticle during reorientation is shown to reduce with a decrease of electric field strength. The fastest reorientation time recorded, 0.11 seconds, is achieved with a field strength of 60 V (1 V/μm). The elongated electro-responsive nanoparticle remains active at a relatively low voltage of 5 V (0.08 V/μm), however, this is the threshold voltage. At this low voltage, the field strength is not strong enough to cause complete rotation of the elongated electro-responsive nanoparticle. As seen in FIG. 6C, the elongated electro-responsive nanoparticle only rotates approximately 75°.

Figure 6D:
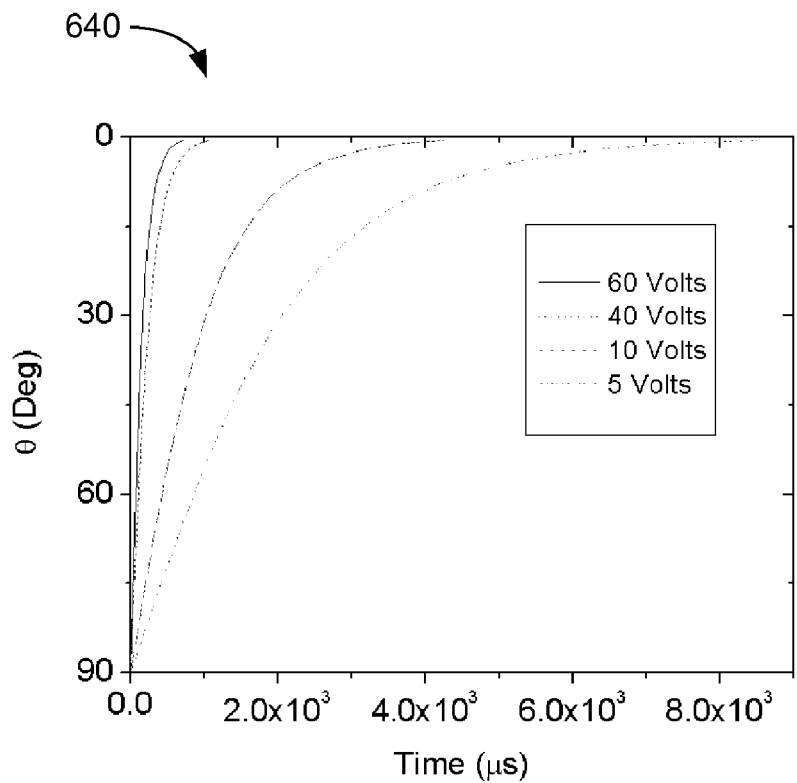

FIG. 6D is a graphical plot 640 depicting the predicted reorientation times of the elongated electro-responsive nanoparticle with an application of different applied voltages (60 V, 40 V, 10 V, and 5 V). Again, the predicted reorientation times are faster than the measured reorientation times. For example, at 60 V and 5 V, the predicted reorientation times are approximately 700 μs and 8500 μs, respectively. In comparison, the reorientation of the elongated electro-responsive nanoparticle at 5 V does not reach 90°.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. A stimulus responsive nanoparticle system, comprising:
   a first electrode;
   a second electrode substantially parallel to the first electrode; and
   a plurality of elongated electro-responsive nanoparticles having a parallel axial director dispersed within a nonconductive fluid between the first and second electrodes, the plurality of elongated electro-responsive nanoparticles responsive to an electric field established between the first and second electrodes, where the plurality of elongated electro-responsive nanoparticles are configured to translate toward the first electrode while remaining substantially perpendicular to the established electric field.

2. The system of claim 1, wherein the plurality of elongated electro-responsive nanoparticles are electro-responsive nanorods.

3. The system of claim 2, wherein the elongated electro-responsive nanoparticles are reactive mesogen nanorods.

4. The system of claim 1, wherein the plurality of elongated electro-responsive nanoparticles are dispersed between the first and second electrodes in a nonconductive dispersion agent.

5. The system of claim 1, wherein the first and second electrodes each comprise a conducting film on an insulating substrate.

6. The system of claim 1, wherein the first electrode comprises a thin film transistor.

7. The system of claim 1, wherein the first and second electrodes are substantially planar.

8. The system of claim 7, wherein the first and second electrodes are separated by a distance equal to a predefined length of the elongated electro-responsive nanoparticles.

9. The system of claim 7, wherein the first and second electrodes are separated by a distance less than a longest length of the elongated electro-responsive nanoparticles.

* * * * *

UNITED STATES PATENT AND TRADEMARK OFFICE
CERTIFICATE OF CORRECTION

PATENT NO. : 8,362,760 B2  
APPLICATION NO. : 12/388987  
DATED : January 29, 2013  
INVENTOR(S) : Cairns et al.

It is certified that error appears in the above-identified patent and that said Letters Patent is hereby corrected as shown below:

On the title page, item (75) Inventors:  
        Change "Darren Robert Cairns" to --Darran Robert Cairns--.

Signed and Sealed this  
Fifth Day of March, 2013

Teresa Stanek Rea  
*Acting Director of the United States Patent and Trademark Office*